United States Patent [19]
Sawahata

[11] Patent Number: 5,502,654
[45] Date of Patent: Mar. 26, 1996

[54] METHOD FOR ANALYZING LIGHT INTENSITY DISTRIBUTION IN PROJECTION SYSTEMS

[75] Inventor: Koichi Sawahata, Tokyo, Japan

[73] Assignee: NEC Corporation, Tokyo, Japan

[21] Appl. No.: 332,144

[22] Filed: Oct. 31, 1994

[30] Foreign Application Priority Data

Oct. 29, 1993 [JP] Japan ................................. 5-271111

[51] Int. Cl.$^6$ ................................................. G02B 15/00
[52] U.S. Cl. ........................................ 364/525; 382/280
[58] Field of Search ................................ 364/525, 524, 364/556, 576; 382/280; 356/303, 237, 121; 250/550

[56] References Cited

U.S. PATENT DOCUMENTS

| | | | |
|---|---|---|---|
| 5,075,883 | 12/1991 | Friedman et al. ....................... | 364/553 |
| 5,420,417 | 5/1995 | Shiraishi ................................ | 356/121 |
| 5,442,189 | 8/1995 | Hagiwara ............................... | 356/237 |

OTHER PUBLICATIONS by Michael Yeung, "Modeling Aerial Images in Two and Three Dimensions", *Proceedings of Kodak Microelectronics Seminar Interface '85*, California, 1980, pp. 115–126.

by Marc D. Levenson et al., "The Phase–Shifting Mask II: Imaging Simulations and Submicrometer Resist Exposures", *IEEE Transactions on Electron Devices*, vol. ED–31, No. 6, Jun. 1984, pp. 753–762.

*Primary Examiner*—James P. Trammell
*Attorney, Agent, or Firm*—Young & Thompson

[57] ABSTRACT

A novel method for analyzing a light intensity distribution on a flat surface in a projection system wherein a pattern is projected by use of a light through a pupil on the flat surface. The pattern is analyzed into plural polygonal elements where a combination of the polygonal elements constitutes the pattern. Fourier transformations of vertexes of each of the polygonal elements except for the pattern are calculated for subsequent addition and subtraction of the Fourier transformations of all the polygonal elements to thereby obtain a Fourier transformation of the pattern. A product of the Fourier transformation of the pattern and a pupil function is calculated for the pupil. An invert Fourier transformation of the product is calculated to thereby obtain a light intensity distribution.

20 Claims, 5 Drawing Sheets

FOURIER TRANSFORMATION

FAST FOURIER TRANSFORMATION

METHOD FOR ANALYZING LIGHT INTENSITY DISTRIBUTION IN PROJECTION SYSTEMS

BACKGROUND OF THE INVENTION

The invention relates to a method for analyzing optical intensity distributions of objects in an optical projection system, and more particularly to a method for analyzing optical intensity distributions for imaging simulation of mask patterns used in semiconductor photo-lithography processes.

It has been well known in the field of semiconductors that the optical projection system is useful for photo-lithography needed to prepare any desired resist patterns to be used in fabrication processes of semiconductor devices such as semiconductor integrated circuits. FIG. 1 illustrates a configuration of the optical projection system has a light source 1 emitting a ray, first to third condenser lenses 2, 4 and 6, a mask 3 including a pattern 101 and a pupil 5 as well as an image screen 7. The above elements comprising the optical projection system are aligned on a center axis. The first condenser lens 2 is placed to face the light source 1 for receiving a spreading ray emitted from the light source 1 and subsequent conversion of the spreading ray into a parallel ray. The second condenser lens 4 is placed between the first and third condenser lenses 2 and 6. The mask 3 including the pattern 101 is placed between the first and second condenser lenses 2 and 4 so that the parallel ray is irradiated on the mask 3. The parallel ray is then transmitted through the mask 3 with the pattern 101 to the second condenser lens 4 by which the parallel ray is converted into a unifocal ray. The unifocal ray has a focus point at an intermediate point of a half-distance of a distance between the second and third condenser lenses 4 and 6. At the intermediate point between the second and third condenser lenses 4 and 6, the pupil 5 is positioned. The pupil 5 has a semicircular aperture through which the ray is transmitted and a semicircular opaque counterpart for restricting the transmission of the ray. The transmitted unifocal ray is received by the third condenser lens 6 for conversion thereof into the parellel ray that is subsequently irradiated on the imaging screen 7 thereby the image of the pattern 101 is projected on the image screen 7.

In the above optical projecting system, the pupil 5 having the semicircular aperture and the opaque semicircular counterpart may generate a ray amplitude distribution or a ray intensity distribution that may be expressed by a parallel-displaced Fourier transformation that is subjected to a parallel displacement of an original Fourier transformation of the pattern 101. The original Fourier transformation is given by F(f, g). An intensity distribution on the pupil 5 of a ray that has been emitted from a point $(p_i, q_i)$ on the light source 1 is then given by a parallel-displaced Fourier transformation $F(f-p_i/\lambda, g-q_i/\lambda)$. A relationship of the transmission and cur off of the ray may be expressed by a pupil function $P(-\lambda Zf, -\lambda Zg)$ in which transparent and opaque portions are expressed by "1" and "0" respectively. Further, it is required to consider an influence of aberration by the lenses, which may be expressed by an exponential function $\exp(j(2\pi/\lambda)W(-\lambda Zf, -\lambda Zg))$. The product of the parallel-displaced Fourier function and the influence of the aberration is defined as the following function K(f, g).

$$K(f, g) = P(-\lambda Zf, -\lambda Zg)\exp(j(2\pi/\lambda)W(-\lambda Zf, -\lambda Zg)) \quad (1)$$

where Z is the distance between pupil 5 and the image screen 7. The ray transmitted through the pupil 5 has such an intensity distribution or an amplitude distribution as given by $F(f-p_i/\lambda, g-q_i/\lambda)K(f, g)$. When the ray is propagated through the third condenser lens 6 onto the image screen 7, then the ray has an intensity distribution or an amplitude distribution that corresponds to one subjected to Fourier transformation of the intensity distribution of the ray at the pupil 5. Accordingly, the intensity distribution on the image screen 7 is given by the following equation.

$$I(x, y,) = 1/n\Sigma i |\int_{-\infty}^{\infty} F(f - P_i/\lambda, q_i/\lambda)K(f, g) X \exp(2xj(f_x + g_y))dfdg|^2 \quad (2)$$

A calculation method of the equation (2) is disclosed in Proceedings of Kodak Microelectronics Seminar INTERFACE' 85. pp. 115–126, "MODELING AERIAL IMAGES IN TWO AND THREE DIMENSIONS". This reference describes about methods of creating two-dimensional imaging models by use of the projection system with computer added design model analysis as well as creating three dimensional of a ray propagating in directions oblique to a surface.

A conventional light intensity distribution analyzing method is to be carried out by the following steps P1 to P6. FIG. 2 is a flow chart of the conventional light intensity distribution analyzing method. In a step P1, a mask pattern is converted into a bit map. A calculation of of Fourier transformation F(f, g) of the mask is carried out in a step P2. The aberration function k(f, g) is calculated based on the pupil equation (1) in a step P3. In a step P4, the Fourier transformation F(f, g) is parallel-displaced by a point $(P_i, q_i)$ on the light source 1 to obtain the parallel-displaced Fourier transformation $F(f-q_i/\lambda, g-q_i/\lambda)$ for subsequent calculation of the product of the parallel-displaced Fourier transformation $F(f-q_i/\lambda, g-q_i/\lambda)$ and the aberration function K(f, g) to find the equation $F(f-q_i/\lambda, g-q_i/\lambda)K(f, g)$. In a step P5, an inverse Fourier transformation of the equation $F(f-q_i/\lambda, g-q_i/\lambda)K(f, g)$ is carried out by fast Fourier transformation to obtain T(F, K). In a step 6, the steps P4 and P5 are repeated for all the elements on the light source 1 for subsequent calculation of a sum of squares of absolute values of individual T(F, K) or $\Sigma |T(F, K)|^2$.

The mask pattern 101 subjected to the Fourier transformation may be a complicated pattern. According to the above conventional method, it is required to calculate the Fourier transformation of any mask patterns including complicated patterns. Methods for calculating the Fourier transformation of any mask patterns including complicated patterns are disclosed in IEEE Transactions on Electron Devices, Vol. ED-31, No. 6, June 1984, "The Phase-Shifting Mask II: Imaging Simulations and Submicrometer Resist Exposures".

In the step 2, the Fourier transformation of the mask pattern may be calculated by the fast Fourier transformation. As well known, the fast Fourier transformation is to be carried out by using redundancy of determinations to calculate descrete Fourier transformation in which a function is sampled at a predetermined distance to obtain discrete values. The fast Fourier transformation is able to convert any patterns. Nevertheless, a result of the calculation of the discrete values would not strictly correspond to a result of the normal Fourier transformation. FIGS. 3A and 3B illustrate waveforms as results of the normal and fast Fourier transformations respectively. The waveforms obtained by the fast Fourier transformation are different from the waveform of the normal Fourier transformation. The mask pattern 101 may be expressed by a step function in which a transparent portion and an opaque portion are set as "1" and "0" respectively. A Fourier-transformed step function has a frequency component range extending to a high frequency region. In sampling processes, the Fourier transformation receives such a frequency restriction as eliminating a high frequency component. As a result, the obtained waveforms have base portions being overlapped on base portions of the adjacent waveforms as illustrated in FIG. 3B. For that reason, the calculation result of the fast Fourier transformation is necessarily different from the result of the normal Fourier transformation. This means that using the fast Fourier necessarily leads to the lowering of a calculation accuracy for calculating the mask pattern. The accuracy of the calculation by the fast Fourier transformation depends upon the number of mashes for sampling in the fast Fourier transformation. A large number of the meshes permit increasing a period of the waveforms illustrated in FIG. 3B. This leads to overlap-free waveforms thereby the calculation accuracy is improved. However, a large number of the meshes requires a time consuming calculation process of the invert Fourier transformation by the fast Fourier transformation in the step P5. Using N×N meshes requires a time proportional to $Nlog_2N \times Nlog_2N$. The increase of the mesh number N requires a considerable increase of the time for the fast Fourier transformation. As described above, the step P5 for the fast Fourier transformation is repeated for all the elements on the light source 1 in the step P6. Accordingly, the step P6 requires a considerable long time.

Consequently, the above conventional intensity distribution analyzing method is engaged with the disadvantages in poor calculation accuracy caused by the frequency restriction in sampling processes of the fast Fourier transformation. The above conventional intensity distribution analyzing method is also engaged with the disadvantages in requirement in the time consuming calculation process of the invert Fourier transformation by the fast Fourier transformation.

SUMMARY OF THE INVENTION

Accordingly, it is a primary object of the present invention to provide a novel method for analyzing a light intensity distribution free from any disadvantages as described above.

It is a further object of the present invention to provide a novel method for analyzing a light intensity distribution in a short time.

It is a still further object of the present invention to provide a novel method for analyzing a light intensity distribution with a high calculation accuracy.

The above and other objects, features and advantages of the present invention will be apparent from the following descriptions.

The invention provides a novel method for analyzing a light intensity distribution on a flat surface in a projection system wherein a pattern is projected by use of a light through a pupil on the flat surface. The method comprises the following steps. The pattern is analyzed into plural polygonal elements where a combination of the polygonal elements constitutes the pattern. Fourier transformations of vertexes of each of the polygonal elements except for the pattern are calculated for subsequent addition and subtraction of the Fourier transformations of all the polygonal elements to thereby obtain a Fourier transformation of the pattern. A product of the Fourier transformation of the pattern and a pupil function is calculated for the pupil. An invert Fourier transformation of the product is calculated to thereby obtain a light intensity distribution.

The pattern may be analyzed into a polygonal outside frame encompassing the pattern and plural kinds of polygonal elements so that a combination of the polygonal elements and the pattern constitutes the polygonal outside frame. The Fourier transformations of vertexes of each of the polygonal elements and the polygonal outside frame may be calculated for subsequent subtraction of the Fourier transformations of all the polygonal elements from the Fourier transformation of the polygonal outside frame to thereby obtain a Fourier transformation of the pattern. The polygonal outside frame may be a rectangle encompassing the pattern. The polygonal elements comprises triangle elements and rectangular elements, each of the triangle and rectangle elements having various sizes. Alternatively, the pattern may be analyzed into plural kinds of polygonal elements constituting the pattern. The Fourier transformations of vertexes of each of the polygonal elements are calculated for subsequent addition of the Fourier transformations of all the polygonal elements to thereby obtain a Fourier transformation of the pattern. The polygonal elements comprises triangle elements and rectangular elements, each of the triangle and rectangle elements having various sizes.

BRIEF DESCRIPTIONS OF THE DRAWINGS

Preferred embodiments of the present invention will hereinafter fully be described in detail with reference to the accompanying drawings.

PREFERRED EMBODIMENTS OF THE PRESENT INVENTION

The invention provides a novel method for analyzing a light intensity distribution on a flat surface in a projection system wherein a pattern is projected by use of a light through a pupil on the flat surface. The method comprises the following steps. The pattern is analyzed into plural polygonal elements where a combination of the polygonal elements constitutes the pattern. Fourier transformations of vertexes of each of the polygonal elements except for the pattern are calculated for subsequent addition and subtraction of the Fourier transformations of all the polygonal elements to thereby obtain a Fourier transformation of the pattern. A product of the Fourier transformation of the pattern and a pupil function is calculated for the pupil. An invert Fourier transformation of the product is calculated to thereby obtain a light intensity distribution.

The pattern may be analyzed into a polygonal outside frame encompassing the pattern and plural kinds of polygonal elements so that a combination of the polygonal elements and the pattern constitutes the polygonal outside frame. The Fourier transformations of vertexes of each of the polygonal elements and the polygonal outside frame may be calculated for subsequent subtraction of the Fourier transformations of all the polygonal elements from the Fourier transformation of the polygonal outside frame to thereby obtain a Fourier transformation of the pattern. The polygonal outside frame may be a rectangular encompassing the pattern. The polygonal elements comprises triangle elements and rectangular elements, each of the triangle and rectangle elements having various sizes.

Alternatively, the pattern may be analyzed into plural kinds of polygonal elements constituting the pattern. The Fourier transformations of vertexes of each of the polygonal elements are calculated for subsequent addition of the Fourier transformations of all the polygonal elements to thereby obtain a Fourier transformation of the pattern. The polygonal elements comprises triangle elements and rectangular elements, each of the triangle and rectangle elements having various sizes.

Figure 1:
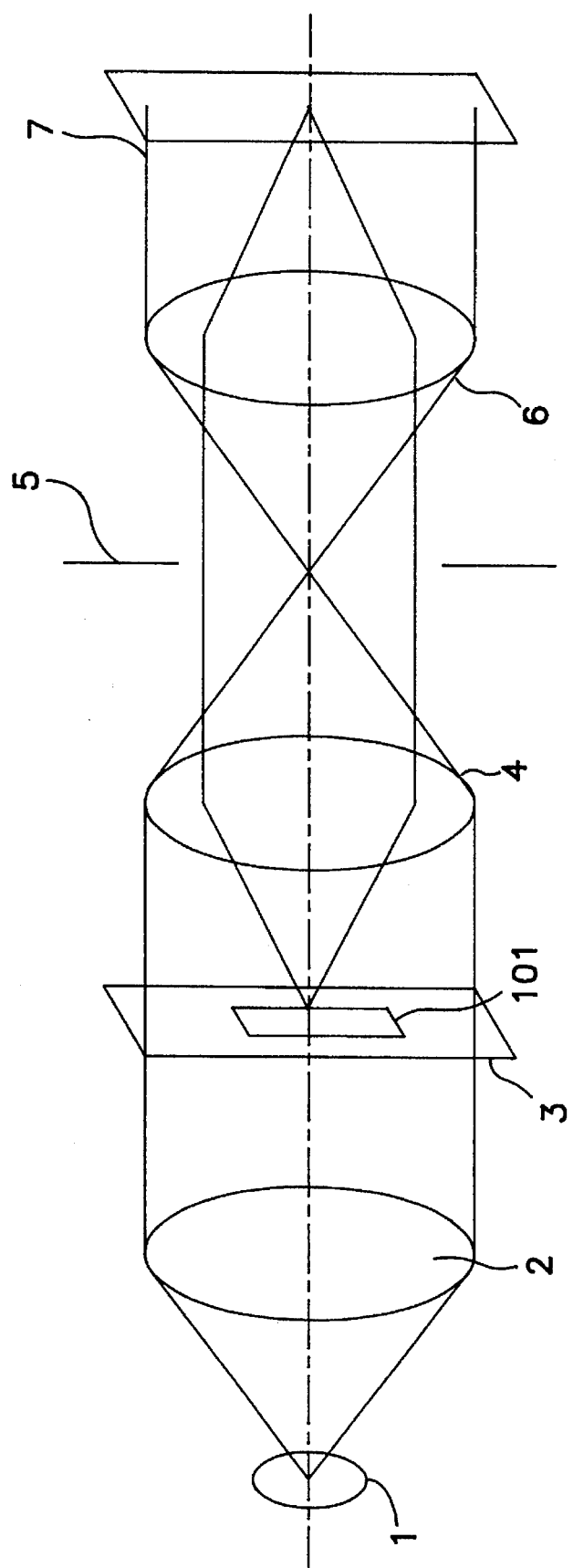
FIG. 1 is a view illustrative of the configuration of the optical projection system.
Figure 2:
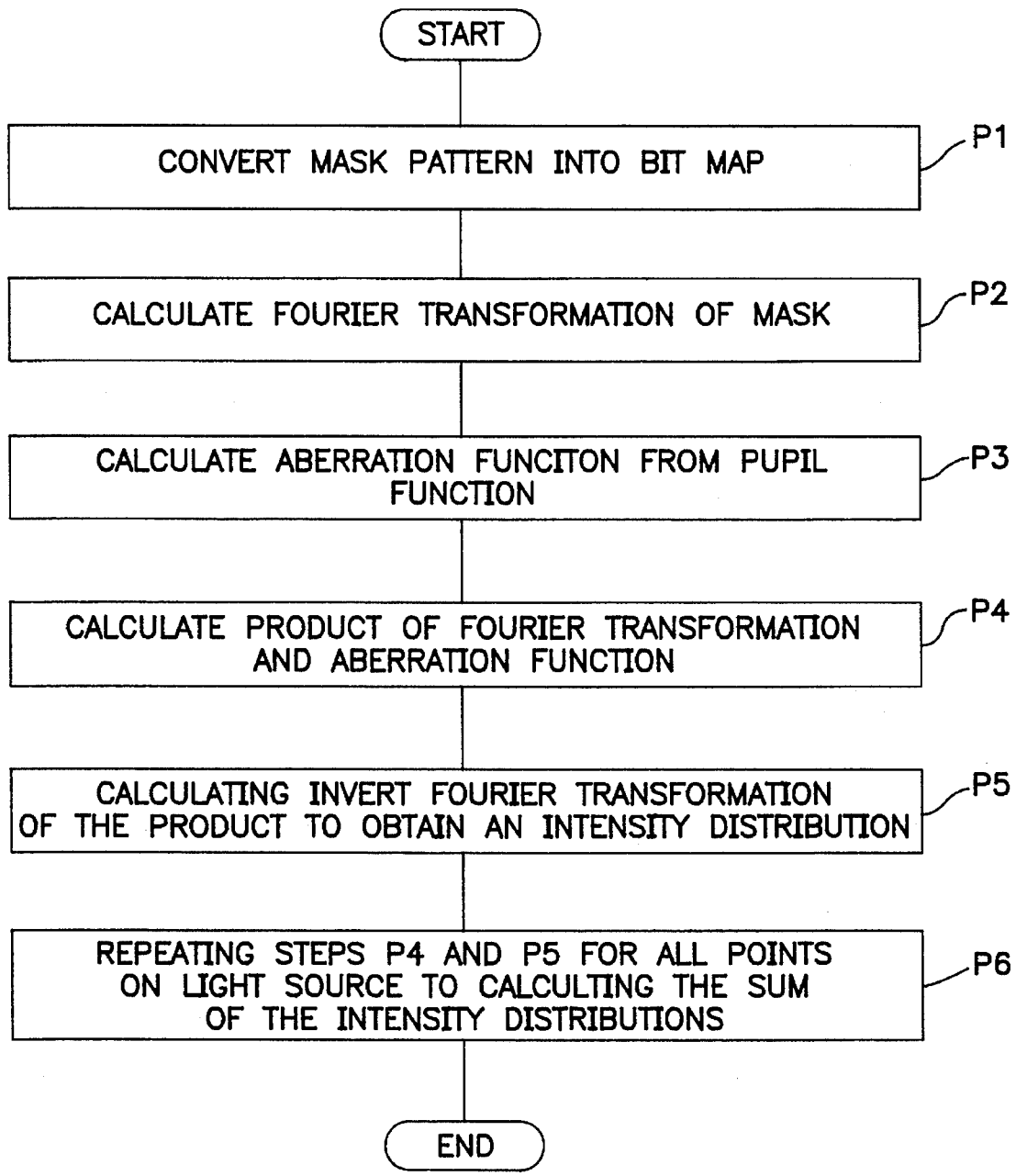
FIG. 2 is a flow chart of the conventional light intensity distribution method used in the projection system.
Figure 3A:
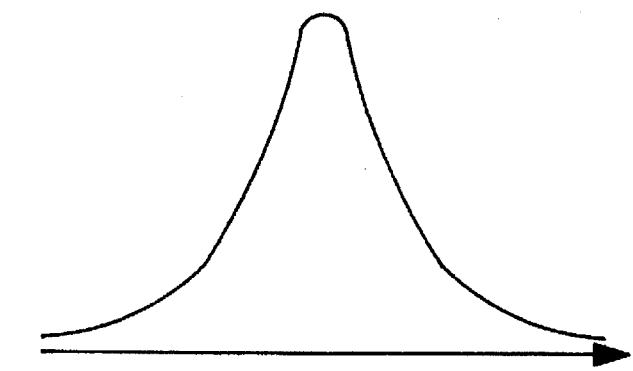
FIG. 3A is a diagram illustrative of a waveform obtained through the normal Fourier transformation.
Figure 3B:
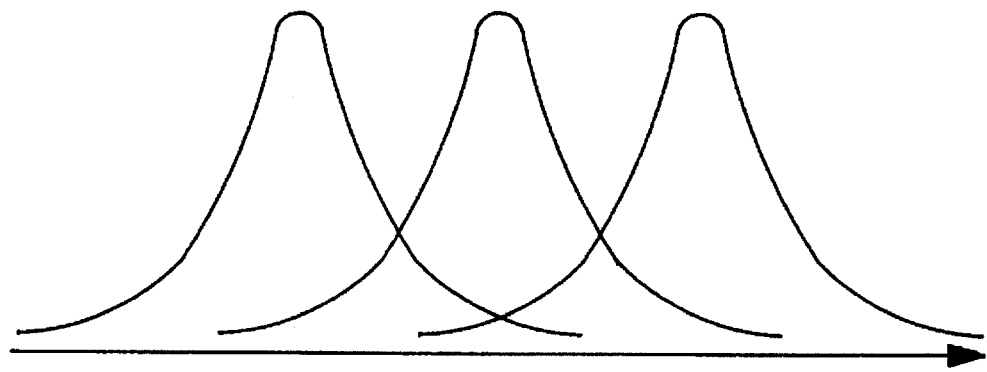
FIG. 3B is a diagram illustrative of a waveform obtained through the fast Fourier transformation.
Figure 4:
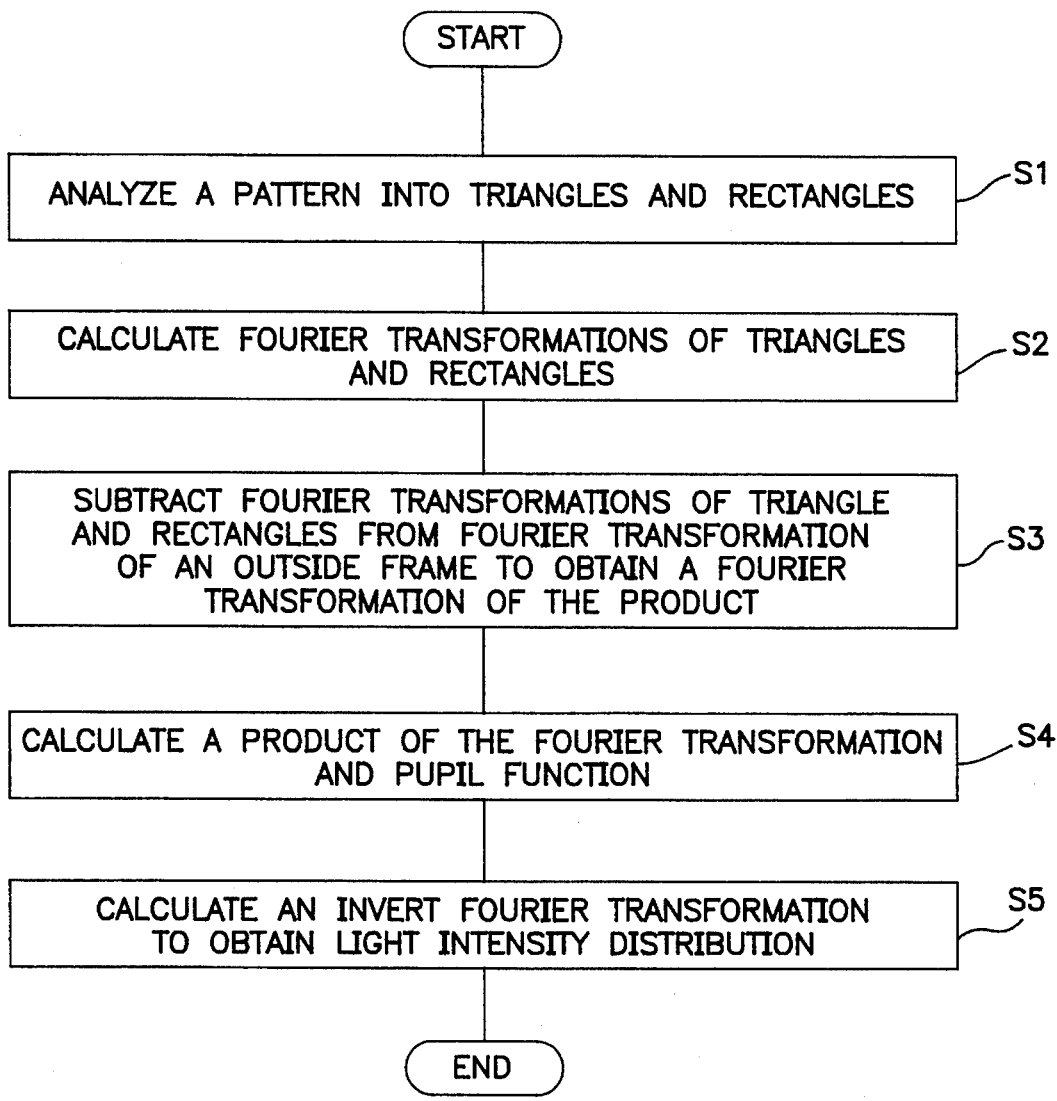
FIG. 4 is a flow chart of a novel light intensity distribution method used in a projection system in a first embodiment according to the present invention.
Figure 5:
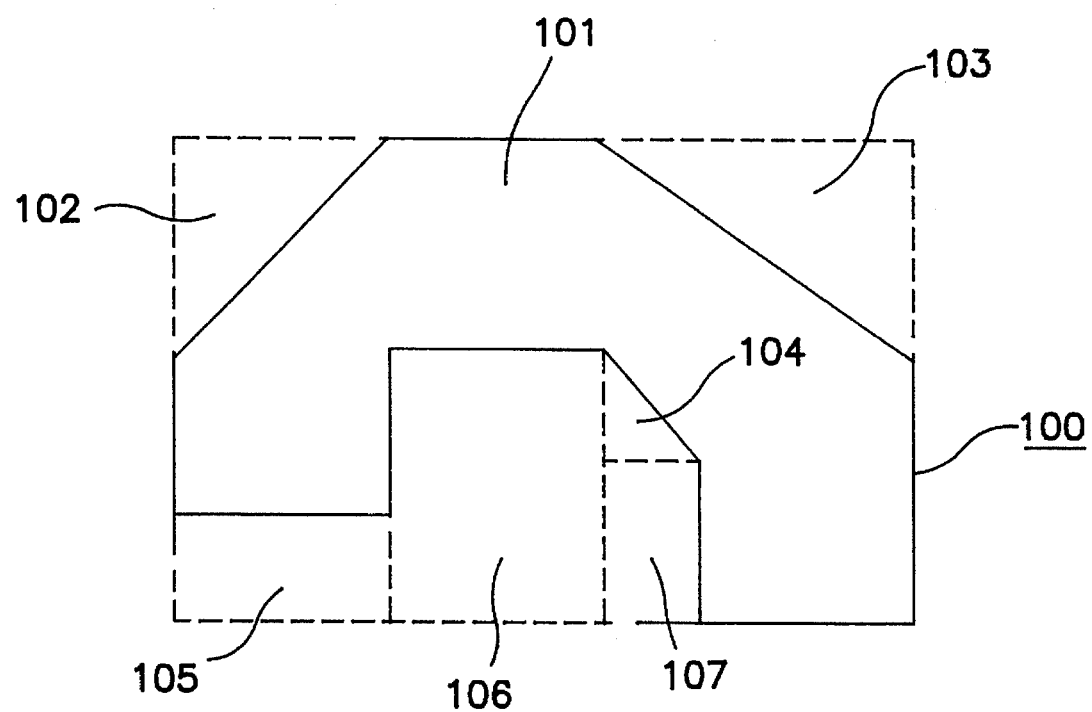
FIG. 5 is a view illustrative of an example of mask patterns to be projected on an imaging screen.

A preferred embodiment of the present invention will be described with reference to FIG. 4 in which a novel light intensity distribution analyzing method comprises the following steps. The description will be made when a mask pattern 101 is as illustrated in FIG. 5. The mask pattern 101 is represented by a real line. The mask pattern 101 corresponds to one prepared by removing from a large rectangule 110 triangles 102, 103 and 104 and small rectangles 105, 106 and 107. The Fourier transformation of each elements 100, 102, 103, 104, 105, 106 and 107 is calculated based on functions of coordinates of vertexes of the each element.

In a first step S1, the mask pattern 101 is analyzed into the triangles 102, 103 and 104 and rectangles 100, 105, 106 and 107. In a second step S2, Fourier transformations of the individual triangles and rectangles are calculated based on functions of coordinations of vertexes of each the triangles and rectangles. In a third step S3, Fourier transformations of individual triangles 102, 103 and 104 and rectangles 105, 106 and 107 are subtracted from a Fourier transformation of the rectangle 100 to thereby obtain a Fourier transformation of the mask pattern 101. In a fourth step S4, a product of the Fourier transformation of the mask pattern 101 and the pupil function is calculated. The description of the pupil function has been described in the background of the invention. An inverse Fourier transformation of the product is made by use of the fast Fourier transformation to calculate the intensity distribution function (2) to obtain a light intensity distribution in which the intensity distribution function has been described in the background of the invention.

The The novel method analyzes the mask pattern directly to combinations of triangles and rectangles for separate Fourier transformations of the triangles and rectangles and subsequent addition and subtraction of the individual Fourier transformations of the triangles and rectangles to obtain a Fourier transformation of the mask pattern prior to the invert Fourier transformation of the mask pattern to obtain the required light intensity distribution on the imaging screen. Contrary to the conventional method, the novel method for analyzing the intensity distribution is free from the fast Fourier transformation of the mask pattern on the bit map. No use of the fast Fourier transformation of the mask pattern on the bit map permits in a high accuracy the Fourier transformation of the mask pattern thereby resulting in a high accuracy analyses of the intensity distribution in the projection system. According to the novel method, the Fourier transformations are carried out in the second and fifth steps S2 and S5 only, but none of any Fourier transformation is carried out in the other steps S1, S 3 and S4 so that no error is caused by no discretion process of the Fourier transformation. The fast Fourier transformation is carried in the fifth step only for invert transformation. This Fourier transformation generates only an ignorable error due to none of any discretion in calculation.

A time needed for analyzing the mask pattern depends upon the number of meshes for sampling or the number of elements constructing the mask pattern, but be independent from whether analytical Fourier transformation or non analytical fast Fourier transformation is made. The analytical Fourier transformation according to the present invention is free from any requirement for increasing the number of the sampling meshes or elements constructing the mask pattern contrary to the fast Fourier transformation. Using such analytical Fourier transformation permits a high speed intensity distribution analyses. Under various sampling meshes, for example, 64×64, 128×128 and 256×256, the intensity distribution analysis are made by the analytical Fourier transformation and the non-analytical fast Fourier transformation separately for comparison. The intensity distribution obtained by the non-analytical fast Fourier transformation is varied by variation of the number of the sampling meshes namely the sampling elements constructing the mask pattern. By contrast, the intensity distribution obtained by the analytical Fourier transformation shows no variation by variation of the number of the sampling meshes namely the sampling elements constructing the mask pattern.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the invention which fall within the spirit and scope of the invention.

What is claimed is:

1. A method for analyzing a light intensity distribution on a flat surface in a projection system wherein a pattern is projected by use of a light through a pupil on said flat surface, said method comprising the steps of:

analyzing said pattern into plural polygonal elements where a combination of said polygonal elements constitutes said pattern;

calculating Fourier transformations of vertexes of each of said polygonal elements except for said pattern for subsequent addition and subtraction of said Fourier transformations of all said polygonal elements to thereby obtain a Fourier transformation of said pattern;

calculating a product of said Fourier transformation of said pattern and a pupil function for said pupil; and calculating an invert Fourier transformation of said product to thereby obtain a light intensity distribution.

2. The method as claimed in claim 1, wherein said pattern is analyzed into a polygonal outside frame encompassing said pattern and plural kinds of polygonal elements so that a combination of said polygonal elements and said pattern constitutes said polygonal outside frame.

3. The method as claimed in claim 2, wherein said Fourier transformations of vertexes of each of said polygonal elements and said polygonal outside frame are calculated for subsequent subtraction of said Fourier transformations of all said polygonal elements from said Fourier transformation of said polygonal outside frame to thereby obtain a Fourier transformation of said pattern 4. The method as claimed in claim 2, wherein said polygonal outside frame is a rectangular encompassing said pattern.

5. The method as claimed in claim 2, wherein said polygonal elements comprises triangle elements and rectangular elements, each of said triangle and rectangle elements having various sizes.

6. The method as claimed in claim 5, wherein said triangle elements comprise right triangle elements.

7. The method as claimed in claim 1, wherein said pattern is analyzed into plural kinds of polygonal elements constituting said pattern.

8. The method as claimed in claim 7, wherein said Fourier transformations of vertexes of each of said polygonal elements are calculated for subsequent addition of said Fourier transformations of all said polygonal elements to thereby obtain a Fourier transformation of said pattern.

9. The method as claimed in claim 7, wherein said polygonal elements comprises triangle elements and rectangular elements, each of said triangle and rectangle elements having various sizes.

10. The method as claimed in claim 9, wherein said triangle elements comprise right triangle elements.

11. The method as claimed in claim 1, wherein said invert Fourier transformation is carried out by use of a fast Fourier transformation.

12. The method as claimed in claim 1, wherein said pattern comprises a pattern of a photo-resist mask.

13. The method as claimed in claim 1, wherein said pupil function is a step function expressing a transparent portion as "1" and an opaque portion "0".

14. A method for analyzing a light intensity distribution on a flat surface in a projection system wherein a pattern is projected by use of a light through a pupil on said flat surface, said method comprising the steps of:

analyzing said pattern into a polygonal outside frame and plural kinds of polygonal elements where a combination of said pattern and said polygonal elements constitutes said polygonal outside frame;

calculating Fourier transformations of vertexes of each of said polygonal outside frame and all said polygonal elements except for said pattern;

subtracting all said Fourier transformations of said polygonal elements from said Fourier transformation of said polygonal outside frame to thereby obtain a Fourier transformation of said pattern;

calculating a product of said Fourier transformation of said pattern and a pupil function for said pupil; and calculating an invert Fourier transformation of said product to thereby obtain a light intensity distribution.

15. The method as claimed in claim 14, wherein said invert Fourier transformation is carried out by use of a fast Fourier transformation.

16. The method as claimed in claim 14, wherein said polygonal outside frame is a rectangular encompassing said pattern.

17. The method as claimed in claim 14, wherein said polygonal elements comprises triangle elements and rectangular elements, each of said triangle and rectangle elements having various sizes.

18. The method as claimed in claim 17, wherein said triangle elements comprise right triangle elements.

19. The method as claimed in claim 14, wherein said pattern comprises a pattern of a photo-resist mask.

20. The method as claimed in claim 14, wherein said pupil function is a step function expressing a transparent portion as "1" and an opaque portion "0".

* * * * *